United States Patent
Schneider

(10) Patent No.: US 7,889,102 B2
(45) Date of Patent: Feb. 15, 2011

(54) LZSS WITH MULTIPLE DICTIONARIES AND WINDOWS

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 59 days.

(21) Appl. No.: 12/394,001

(22) Filed: Feb. 26, 2009

(65) Prior Publication Data

US 2010/0214137 A1 Aug. 26, 2010

(51) Int. Cl.
*H03M 7/34* (2006.01)
(52) U.S. Cl. .......................................... 341/51; 710/62
(58) Field of Classification Search ............. 341/50–70, 341/106–109; 710/33, 35, 62, 65, 68
See application file for complete search history.

(56) References Cited

U.S. PATENT DOCUMENTS

| 5,621,403 | A  | * | 4/1997  | Reznik      | 341/51  |
|-----------|----|---|---------|-------------|---------|
| 6,218,970 | B1 | * | 4/2001  | Jaquette    | 341/106 |
| 6,466,999 | B1 | * | 10/2002 | Sliger et al. | 710/68  |
| 6,577,254 | B2 | * | 6/2003  | Rasmussen   | 341/51  |
| 6,650,261 | B2 | * | 11/2003 | Nelson et al. | 341/106 |
| 7,365,658 | B2 | * | 4/2008  | Todorov et al. | 341/63 |

* cited by examiner

*Primary Examiner*—Lam T Mai
(74) *Attorney, Agent, or Firm*—Blakely, Sokoloff, Taylor & Zafman LLP

(57) ABSTRACT

A method and apparatus for compressing data is described. An input string to be compressed is received. The input string is encoded with compressor using a compression algorithm using several sizes of dictionaries and windows. The compressor processes the input string with a selected size of the dictionary and window yielding the most compression of the input string among the different sizes of dictionaries and windows.

20 Claims, 4 Drawing Sheets

LZSS WITH MULTIPLE DICTIONARIES AND WINDOWS

TECHNICAL FIELD

Embodiments of the present invention relate to data compression, and more particularly, to improving the compression ratio of data compression algorithm.

BACKGROUND

Data compression or source coding is the process of encoding information using fewer bits than an unencoded representation would use through use of specific encoding schemes. As with any communication, compressed data communication only works when both the sender and receiver of the information understand the encoding scheme.

One data compression algorithmic, known as deflate algorithm, is based on two compression algorithms: LZSS or LZ77, and Huffman coding. LZSS achieves compression by replacing common strings with pointers to previously seen occurrences of the string. Huffman coding replaces common byte values with shorter bit sequences and uncommon byte values with longer sequences.

During compression, the compressor can encode a particular block in two different ways: First, it can used a fixed Huffman coding tree, which is defined in the RFC that defines the deflate algorithm. Second, the compressor can examine the block being compressed and generate an optimal Huffman coding tree, and transmit the tree definition along with the compressed block.

However, there are trade-offs with either coding scheme. In the first case, the default fixed coding tree may not accurately represent the probabilities actually encountered, which means the compression ratio could be lower than it would be with a more accurate tree (in this context, the compression ratio is the number of bytes shorter than the original data stream for the compressed stream, divided by the original length of the data stream, expressed as a percentage; for example, a file that starts out as 1000 bytes and gets compressed to 720 bytes has a compression ratio of 28%). In the second case, the space required to send the tree definition reduces the compression ratio. In both cases, the window size and the dictionary size are static resulting in an inefficient use since the window and dictionary size may not be optimal for every possible data stream.

BRIEF DESCRIPTION OF THE DRAWINGS

The present invention is illustrated by way of example, and not by way of limitation, in the figures of the accompanying drawings and in which.

DETAILED DESCRIPTION

Described herein is a method and apparatus for compressing data. In one embodiment, a compressor receives an input string to be compressed. The input string is encoded with the compressor using a compression algorithm using several sizes of dictionaries and windows. The compressor processes the input string with a selected size of the dictionary and window yielding the most compression of the input string among the different sizes of dictionaries and windows.

Figure 1:
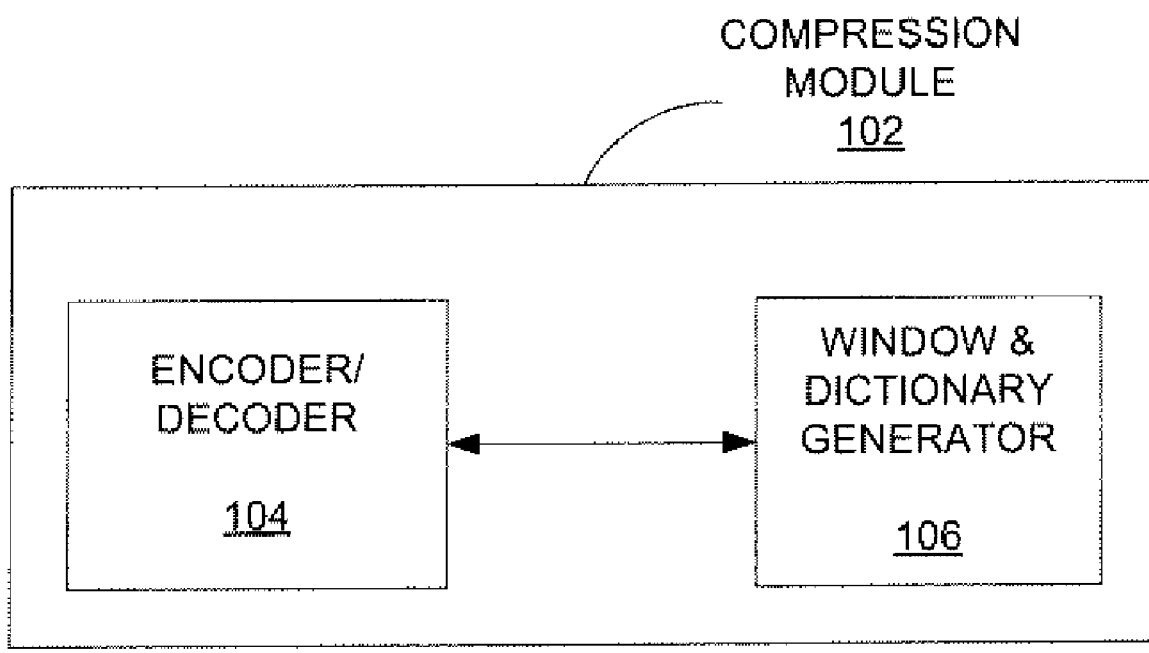
FIG. 1 is a block diagram illustrating one embodiment of a compression module.

FIG. 1 is a block diagram illustrating one embodiment of a compression module 102. Compression module 102 includes an encoder/decoder 104 coupled to a window and dictionary size generator 106. In one embodiment, the encoder/decoder 104 uses a compression algorithm such as LZSS. LZSS achieves compression by replacing common strings with pointers to previously seen occurrences of the string. In other words, LZSS works by trying to replace the current string being encoded with an offset to a matching, previously seen, string and its length. The compression algorithm uses a buffer of the preceding several bytes (called the dictionary) to look for the next several bytes (called the window). The size of the dictionary and the size of the window determine the size of the generated codes, the maximum compression possible, and, to some extent, the expected compression.

Figure 2:
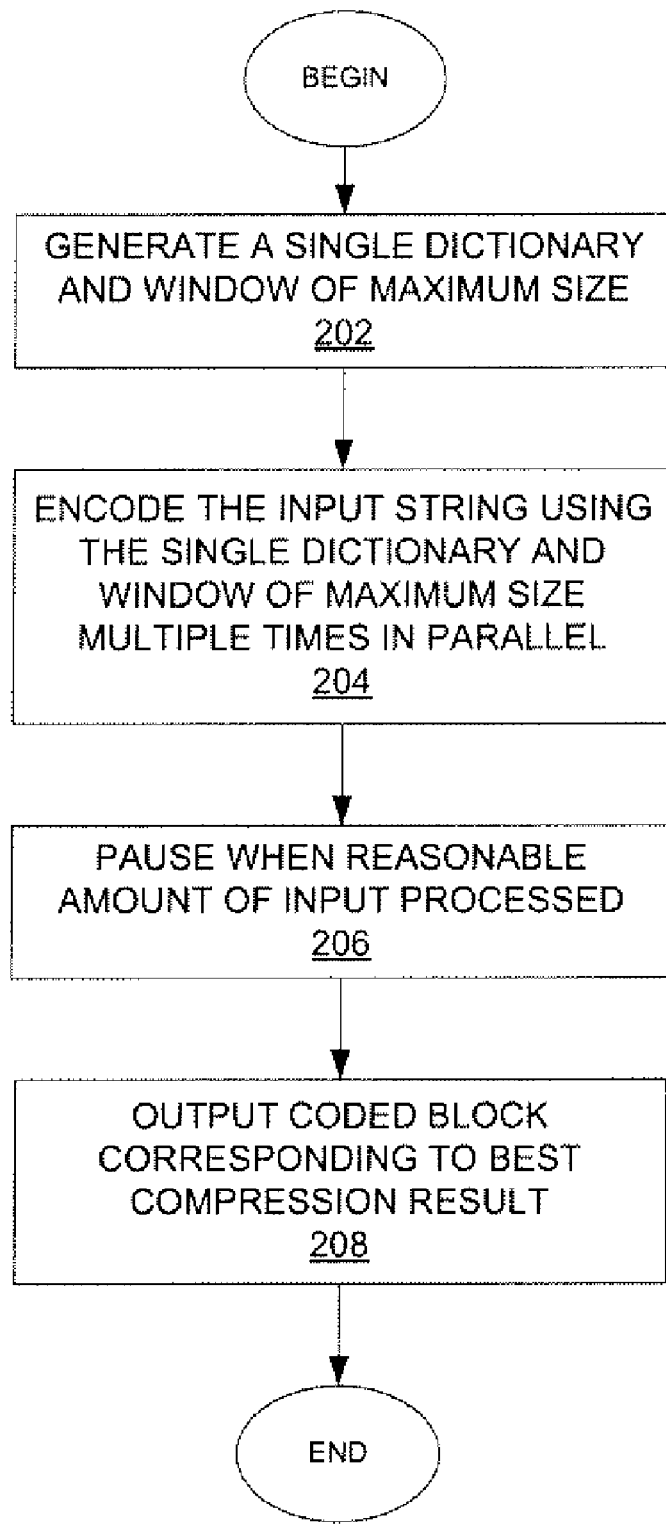
FIG. 2 is a flow diagram of one embodiment of a method for data compression.
Figure 3:
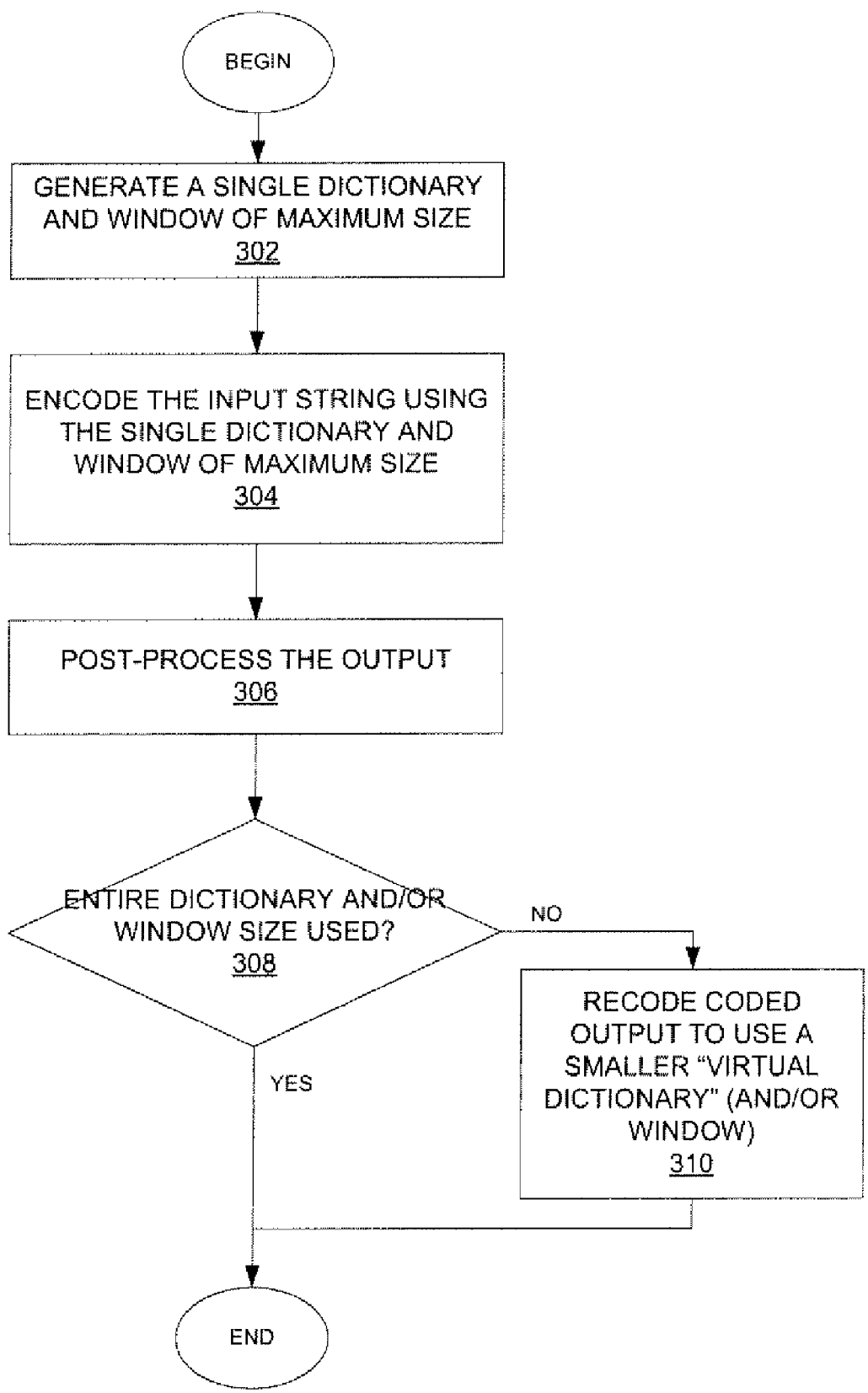
FIG. 3 is a flow diagram of another embodiment of a method for data compression.

Since no one dictionary and window size is optimal for every possible data stream, it may make sense to compress a stream with several different "virtual" dictionary and window sizes generated by window and dictionary size generator 106, and see which combination of parameters yields the best overall compression. FIGS. 2 and 3 illustrates two embodiments of how to the compression module 102 operate.

FIG. 2 is a flow diagram of one embodiment of a method for data compression. At 202, window and dictionary size generator generates a single dictionary of the maximum size. At 204, the compression coding algorithm from encoder/decoder 104 is run multiple times in parallel. At 206, encoder/decoder 104 pauses when a reasonable amount of input has been processed. At 208, encoder/decoder 104 outputs the coded block that corresponds to the best compression result.

Each block would be prefixed with a header that specified the size of the coded block, and the dictionary and window sizes in use. It may also specify that the current block started without using the previous dictionary.

FIG. 3 is a flow diagram of another embodiment of a method for data compression. To gain some of the advantage of this method without actually doing multiple passes of compression on the input stream, a single compression pass can be done on a block of input data, using the maximum dictionary and window sizes. At 302, window and dictionary size generator generates a single dictionary and window of a maximum size. At 304, encoder/decoder 104 encodes the input string using the single dictionary and window of a maximum size. At 306, encoder/decoder 102 performs a post-processing pass run over the compression output to see if the entire dictionary and/or window size was actually used at 308. If not, the coded output is recoded to use a smaller "virtual" dictionary (or window, or both) at 310.

This saves bits because the size of the dictionary and window determines how many bits are required to code a matching string, and how long a matching string can be.

Figure 4:
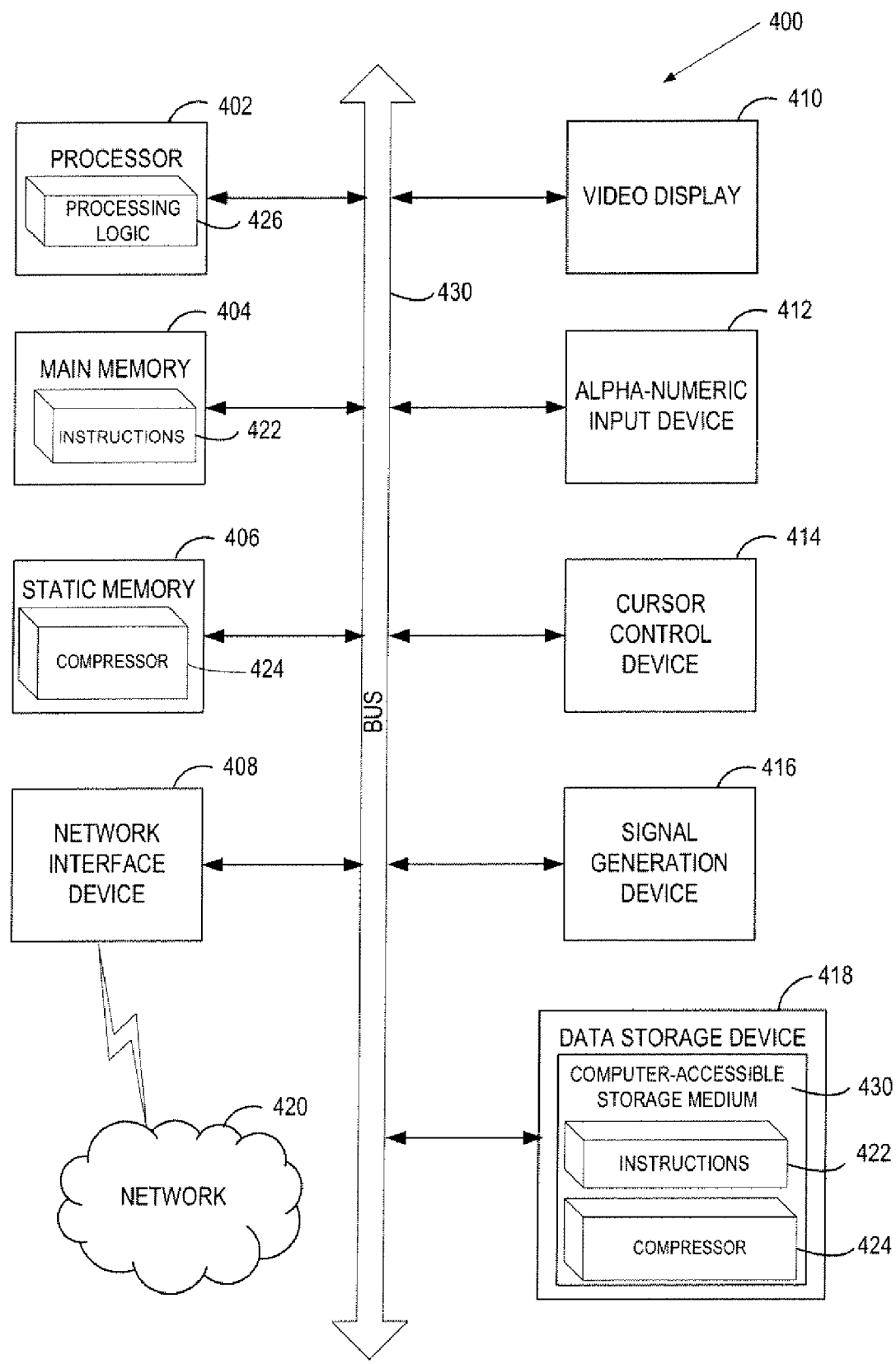
FIG. 4 is a block diagram of an exemplary computer system.

FIG. 4 illustrates a diagrammatic representation of a machine in the exemplary form of a computer system 400 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 400 includes a processing device 402, a main memory 404 (e.g., read-only memory (ROM), flash memory, dynamic random access memory (DRAM) such as synchronous DRAM (SDRAM), a static memory 406 (e.g., flash memory, static random access memory (SRAM), etc.), and a data storage device 418, which communicate with each other via a bus 430.

Processing device 402 represents one or more general-purpose processing devices such as a microprocessor, central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 is configured to execute the processing logic 426 for performing the operations and steps discussed herein.

The computer system 400 may further include a network interface device 408. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), and a signal generation device 416 (e.g., a speaker).

The data storage device 418 may include a machine-accessible storage medium 430 on which is stored one or more sets of instructions (e.g., software 422) embodying any one or more of the methodologies or functions described herein. The software 422 may also reside, completely or at least partially, within the main memory 404 and/or within the processing device 402 during execution thereof by the computer system 400, the main memory 404 and the processing device 402 also constituting machine-accessible storage media. The software 422 may further be transmitted or received over a network 420 via the network interface device 408.

The machine-accessible storage medium 430 may also be used to store a compression algorithm 424 as presently described. The compression algorithm 424 may also be stored in other sections of computer system 400, such as static memory 406.

While the machine-accessible storage medium 430 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical and magnetic media, and carrier wave signals.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "Calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method comprising:
   receiving an input string to be compressed;
   encoding the input string with a compression algorithm with a plurality of dictionaries and windows of different sizes using a compressor; and
   processing the input string with a selected size of the dictionary and window yielding the most compression of the input string among the different sizes of the plurality of dictionaries and windows.

2. The computer-implemented method of claim 1 wherein encoding further comprises:
   generating a single dictionary of a maximum size;
   processing the input string multiple times in parallel;
   pausing when a predetermined amount of input has been processed; and
   outputting a coded block that corresponds to the best compression result.

3. The computer-implemented method of claim 2 wherein each block is prefixed with a header that specifies the size of the coded block, and the dictionary and window sizes in use.

4. The computer-implemented method of claim 3 wherein a current block is encoded without using a previous dictionary.

5. The computer-implemented method of claim 1 wherein encoding further comprising:
   processing a single compression pass on a block of input data using the maximum dictionary and window sizes; and
   running a post-processing pass over a compression output to see if at least one of the entire dictionary and window size was used.

6. The computer-implemented method of claim 5 further comprising:
   re-processing the coded output with at least one of a smaller dictionary and/or window size when the entire dictionary or window size was not used.

7. The computer-implemented method of claim 1 wherein the compression algorithm replaces a current string being encoded with an offset to a matching previously seen string and its length.

8. A non-transitory computer-accessible storage medium including data that, when accessed by a system, cause the system to perform a method comprising:
   receiving an input string to be compressed;
   encoding the input string with a compression algorithm with a plurality of dictionaries and windows of different sizes; and
   processing the input string with a selected size of the dictionary and window yielding the most compression of the input string among the different sizes of the plurality of dictionaries and windows.

9. The non-transitory computer-accessible storage medium of claim 8 wherein encoding further comprises:
   generating a single dictionary of a maximum size;
   processing the input string multiple times in parallel;
   pausing when a predetermined amount of input has been processed; and
   outputting a coded block that corresponds to the best compression result.

10. The non-transitory computer-accessible storage medium of claim 9 wherein each block is prefixed with a header that specifies the size of the coded block, and the dictionary and window sizes in use.

11. The non-transitory computer-accessible storage medium of claim 10 wherein a current block is encoded without using a previous dictionary.

12. The non-transitory computer-accessible storage medium of claim 8 wherein encoding further comprising:
   processing a single compression pass on a block of input data using the maximum dictionary and window sizes; and
   running a post-processing pass over a compression output to see if at least one of the entire dictionary and window size was actually used.

13. The non-transitory computer-accessible storage medium of claim 12 further comprising:
   re-processing the coded output with at least one of a smaller dictionary and window size when the entire dictionary or window size was not used.

14. The non-transitory computer-accessible storage medium of claim 8 wherein the compression algorithm replaces a current string being encoded with an offset to a matching previously seen string and its length.

15. An apparatus comprising:
   a compression encoder configured to receive an input string to be compressed, to encode the input string with a compression algorithm with a plurality of dictionaries and windows of different sizes, to process the input string with a selected size of the dictionary and window yielding the most compression of the input string among the different sizes of the plurality of dictionaries and windows; and
   a dictionary and window size generator coupled to the compression encoder.

16. The apparatus of claim 15 wherein the dictionary and window size generator is configured to generate a single dictionary of a maximum size, wherein the compression encoder is configured to process the input string multiple times in parallel, to pause when a predetermined amount of input has been processed, and to output a coded block that corresponds to the best compression result.

17. The apparatus of claim 16 wherein each block is prefixed with a header that specifies the size of the coded block, and the dictionary and window sizes in use.

18. The apparatus of claim 17 wherein a current block is encoded without using a previous dictionary.

19. The apparatus of claim 15 wherein the compression encoder is configured to process a single compression pass on a block of input data using the maximum dictionary and window sizes, and to run a post-processing pass over a compression output to see if at least one of the entire dictionary and window size was actually used.

20. The apparatus of claim 19 wherein the compression encoder is configured to re-process the coded output with at least one of a smaller dictionary and window size when the entire dictionary or window size was not used.

* * * * *